(12) United States Patent
Hshieh et al.

(10) Patent No.: US 6,445,037 B1
(45) Date of Patent: Sep. 3, 2002

(54) TRENCH DMOS TRANSISTOR HAVING LIGHTLY DOPED SOURCE STRUCTURE

(75) Inventors: Fwu-Iuan Hshieh, Saratoga; Koon Chong So, Fremont; Yan Man Tsui, Union City, all of CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/672,209

(22) Filed: Sep. 28, 2000

(51) Int. Cl.$^7$ ............................................... H01L 29/76
(52) U.S. Cl. ...................... 257/330; 257/329; 257/342
(58) Field of Search .......................... 257/330, 331–334, 257/341, 289, 508, 260, 266, 263, 329, 340, 339, 342

(56) References Cited

U.S. PATENT DOCUMENTS

| | | | |
|---|---|---|---|
| 5,072,266 A | 12/1991 | Bulucea et al. ............. | 257/330 |
| 5,134,448 A | 7/1992 | Johnsen et al. | |
| 5,473,176 A | 12/1995 | Kakumoto ................. | 257/192 |
| 5,489,787 A * | 2/1996 | Amaratunga et al. ........ | 257/137 |
| 5,541,425 A | 7/1996 | Nishihara et al. ........... | 257/139 |
| 5,672,889 A * | 9/1997 | Brown ........................ | 257/77 |
| 5,866,931 A | 2/1999 | Bulucea et al. .............. | 257/331 |
| 5,877,527 A | 3/1999 | Okabe et al. ................ | 257/328 |
| 5,917,216 A | 6/1999 | Floyd et al. ................. | 257/330 |
| 6,127,699 A * | 10/2000 | Ni et al. ...................... | 257/330 |
| 6,262,453 B1 * | 7/2001 | Hshieh ........................ | 257/341 |

* cited by examiner

*Primary Examiner*—Howard Weiss
*Assistant Examiner*—Vikki Hoa B. Trinh
(74) *Attorney, Agent, or Firm*—Mayer Fortkort & Williams, PC; Stuart H. Mayer, Esq.; Karin L. Williams, Esq.

(57) ABSTRACT

A trench DMOS transistor cell includes a substrate of a first conductivity type and a body region located on the substrate, which has a second conductivity type. At least one trench extends through the body region and the substrate. An insulating layer lines the trench and a conductive electrode is placed in the trench overlying the insulating layer. A source region of the first conductivity type is located in the body region adjacent to the trench. The source region includes a first layer and a second layer disposed over the first layer. The first layer has a lower dopant concentration of the first conductivity type relative to the dopant concentration of the second layer.

28 Claims, 5 Drawing Sheets

TRENCH DMOS TRANSISTOR HAVING LIGHTLY DOPED SOURCE STRUCTURE

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use diffusion to form the transistor regions. DMOS transistors are typically employed as power transistors to provide high voltage circuits for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541,425, and 5,866,931.

The cell density in a conventional DMOS circuit is limited to about 100 M/in$^2$. This density corresponds to a distance of about 2.0 microns between adjacent trenches. This limitation arises because the lateral dimension of the source regions of the DMOS transistors must be large enough to allow adequate diffusion of n-type carriers.

Accordingly, it would be desirable to provide a trench DMOS circuit in which the density of transistor cells is increased by reducing the lateral dimension of the source regions.

SUMMARY OF THE INVENTION

The present invention provides a trench DMOS transistor cell that includes a substrate of a first conductivity type and a body region located on the substrate, which has a second conductivity type. At least one trench extends through the body region and the substrate. An insulating layer lines the trench and a conductive electrode is placed in the trench overlying the insulating layer. A source region of the first conductivity type is located in the body region adjacent to the trench. The source region includes a first layer and a second layer disposed over the first layer. The first layer has a lower dopant concentration of the first conductivity type relative to the dopant concentration of the second layer.

In accordance with one aspect of the invention, at least a portion of the first layer of the source region extends to a depth below a surface level of the conductive electrode. In some cases substantially all of the first layer of the source region extends to a depth below a surface level of the conductive electrode. Moreover, in some of these cases substantially all of the first layer of the source region and substantially none of the second layer extends to a depth below a surface level of the conductive electrode.

In accordance with another aspect of the invention, the body region includes a contact region more heavily doped than an underlying portion of the body region. The contact region provides electrical contact to the underlying body region.

In accordance with yet another aspect of the invention, the first layer is doped with phosphorous and the second layer is doped with arsenic.

In accordance with one particular embodiment of the invention, the first layer is doped to a concentration between about $5 \times 10^{17}$ and $5 \times 10^{18}$ cm$^{-3}$ and the second layer is doped to a concentration between about $4 \times 10^9$ and $8.0 \times 10^{19}$.

DETAILED DESCRIPTION

Figure 1:
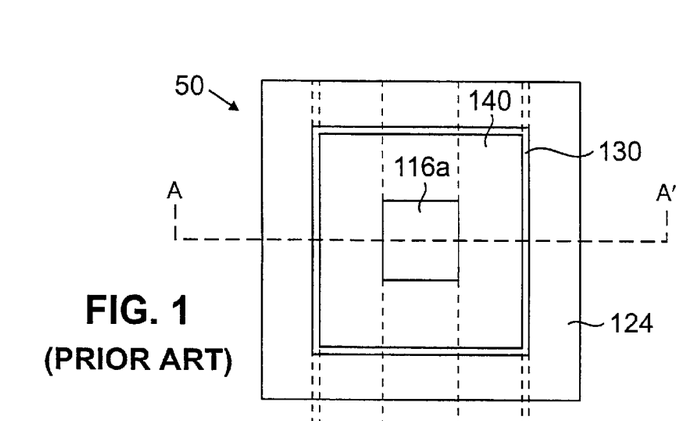
FIG. 1 shows a plan view illustrating an individual cell of conventional trench DMOS transistor.

FIG. 1 shows a plan view of a single conventional trench DMOS transistor cell 50. As seen in cross-section in FIG. 2, the transistor cell 50 is formed from two individual DMOS transistors 20 and 22 that are adjacent to one another. In this particular embodiment of the invention the transistor cell 50 is rectangular in shape in a horizontal cross-section. Transistors 20 and 22 are formed on an n+substrate 100 on which is grown a lightly n-doped epitaxial layer 104. For each transistor formed within doped epitaxial layer 104, a body region 116 of opposite conductivity is provided. The body region 116 includes a heavily doped contact region 116a, which provides electrical contact to the underlying body region for the overlying metallization layer. An n-doped epitaxial layer 140 that overlies most of the body region 116 (except for contact region 116a) serves as the source. Each transistor also includes a rectangularly shaped trench 124 formed in the epitaxial layers, which is open at the upper surface of the structure and defines the perimeter of the transistor cell. A gate oxide layer 130 lines the sidewalls of the trench 124. The trench 124 is filled with polysilicon, i.e., polycrystalline silicon. A drain electrode is connected to the back surface of the semiconductor substrate 100, a source electrode is connected to the two source regions 140 and the body region 116, and a gate electrode is connected to the polysilicon that fills the trench 124.

Figure 2:
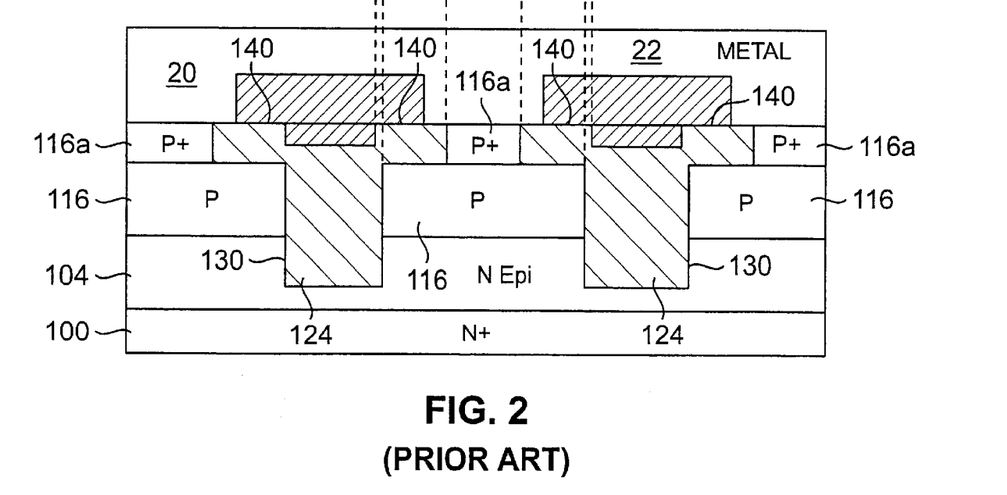
FIG. 2 shows a schematic cross-sectional view of the DMOS transistor cell shown in FIG. 1 taken along line A–A'.

As indicated, the MOSFET shown in FIGS. 1 and 2 has its gate positioned in a vertically oriented trench. This structure is often called a trench vertical DMOSFET. It is "vertical" because the drain contact appears on the back or underside of the substrate and because the channel flow of current from source to drain is approximately vertical. This minimizes the higher resistance associated with bent or curved current paths or with parasitic field effect construction. The device is also doubly diffused (denoted by the prefix "D") because the source region is diffused into the epitaxial material on top of a portion of the earlier-diffused body region of opposite conductivity type. This structure uses the trench side wall area for current control by the gate and has a substantially vertical current flow associated with it. As previously mentioned, this device is particularly appropriate for use as a power switching transistor where the current carried through a given transverse silicon area is to be maximized.

It should be noted that the transistor cell 50 need not have a rectangular shape for basic transistor operation, but more generally may have any polygonal shape. However, a regular rectangular shape and a regular hexagonal shape are the most convenient for layout purposes. Alternatively, rather than having a closed-cell geometry as depicted in the figures, the transistor cell may have an open or stripe geometry. Examples of various transistor cell geometries are shown in the previously mentioned references.

As previously mentioned, the cell density in a conventional DMOS circuit is limited to about 100 M/in2. This limitation arises for the following reason. During the fabrication process, the polysilicon 124 filling the trench is etched to optimize its thickness and to expose the portion of the gate oxide layer 130 that extends over the surface of the body 116. However, it is difficult to achieve a polysilicon layer 124 that is uniformly thick across its surface because both the polysilicon deposition process and the etching process are difficult to control with precision. As a result, as seen in FIG. 2, the surface of the polysilicon layer 124 filling the trench is typically below the surface level of the adjacent source regions 140. However, it is important that the source regions 140 vertically overlap the polysilicon 124 filling the trench to ensure that there is a continuous conductive path from the source to the drain. That is, the source region 140 should extend to a depth below the surface level of the polysilicon 124. To ensure that there is such overlap, the depth of the source regions 140 must be greater than what would otherwise be the case if the surface of the polysilicon layer were at the same level of the surface of the source regions 140. Because the source regions 140 must be increased in thickness, their lateral dimensions also increase by a corresponding amount. This increase in the lateral dimensions arises because the n-type dopants diffuse in all directions and thus when the dopants are diffused to a greater depth they also diffuse a greater distance in the lateral direction. Accordingly, the density of transistor cells that can be fabricated on a single substrate is limited by the lateral dimension of the source regions 140.

Figure 3:
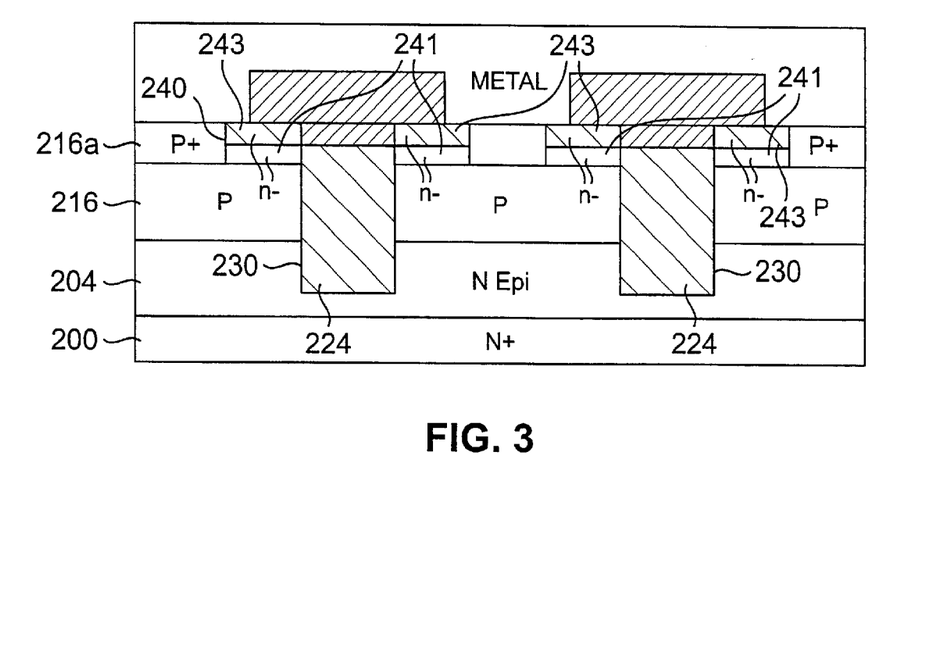
FIG. 3 shows a schematic cross-sectional view of a trench DMOS transistor constructed in accordance with the present invention.

In accordance with the present invention, the lateral dimension of the source regions can be reduced by providing a source region that is composed of two portions having different dopant concentrations. FIG. 3 shows one embodiment of the invention that includes a lightly n-doped epitaxial layer 204 deposited on a heavily n-doped substrate. The trench DMOS transistor includes p-doped body region 216 having contact region 216a, n-doped source regions 240, and a polysilicon filled trench 224 that is lined with a gate oxide layer 230. Drain, source and gate electrodes are provided in the conventional manner.

As seen in FIG. 3, the source regions 240 are composed of a lightly n-doped layer 241 over which is formed a heavily n-doped layer 243. For example, in one embodiment of the invention lightly doped layer 241 is doped to a concentration of about $1 \times 10^{18}$ cm$^{-3}$ and more heavily doped layer 243 is doped to a concentration of about $5 \times 10^{19}$ cm$^{-3}$. The lightly n-doped layer 241 serves to vertically overlap the polysilicon 224 filling the trench so that the channel forms a continuous conductive path while the heavily n-doped layer 243 serves as the primary layer in which diffusion occurs. Since the effective thickness of the source region in which diffusion takes place is now reduced relative to the thickness of the source region in a conventional trench DMOS transistor such as shown in FIG. 2, the lateral dimension of the source regions can be reduced by a corresponding amount. For example, it has been demonstrated that the present invention can reduce the distance between adjacent trenches to about 1.3 microns, which corresponds to a cell density of about 200 M cells/in$^2$)

At the outset it might be concluded that the on-resistance of the inventive trench DMOS transistor is greater than for a conventional trench DMOS transistor. However, this turns out not to be the case because the entire lightly n-doped source layer 241 operates in an accumulation mode when the device is turned on.

The inventive DMOS device shown in FIG. 3 may be fabricated in accordance with any conventional processing technique. While one processing technique will be described below, it should be understood that the fabrication of the present invention is not limited to this technique, which is presented only by way of illustration.

FIGS. 4(*a*)–4(*f*) show a series of exemplary steps that are performed to form the DMOS device depicted in FIG. 2. In FIG. 4(*a*), an N-doped epitaxial layer 404 is grown on a conventionally N+ doped substrate 400. Epitaxial layer 404 is typically 5.5 microns in thickness for a 30 V device. Next, P-body region. 416 is formed in an implantation and diffusion step. Since the P-body implant is uniform across the substrate, no mask is needed. The P-body regions are boron implanted at 40 to 60 KeV with a dosage of about $5.5 \times 10^{13}$/cm$^3$.

In FIG. 4(*b*), a mask layer is formed by covering the surface of epitaxial layer 404 with an oxide layer, which is then conventionally exposed and patterned to leave mask portions 420. Mask portions 420 are used for defining the location of the trenches. Trenches 424 are dry etched through the mask openings by reactive ion etching to a depth that typically ranges from 1.5 to 2.5 microns. In FIG. 4(*c*), the sidewalls of each trench are smoothed. First, a dry chemical etch may be used to remove a thin layer of oxide (typically about 500–1000 angstroms) from the trench sidewalls to eliminate damage caused by the reactive ion etching process. Next, a sacrificial silicon dioxide layer 450 is grown over trenches 424 and mask portions 420. The sacrificial layer 450, as well as mask portions 420, are removed either by a buffer oxide etch or an HF etch so that the resulting trench sidewalls are as smooth as possible.

As shown in FIG. 4(*d*), the gate oxide layer 430 is then deposited on the entire structure so that it covers the trench walls and the surface of p-body 416. Gate oxide layer 130 typically has a thickness in the range of 500–800 angstroms. Next, the trenches 424 are filled with polysilicon 452, i.e., polycrystalline silicon. Prior to deposition, the polysilicon is typically doped with phosphorous chloride or implanted with arsenic or phosphorous to reduce its resistivity, typically within the range of 20 Ω/m. In some embodiments of the invention the polysilicon may be deposited in a two-step process. In the first step, a layer of undoped polysilicon is deposited to line the sidewalls of the trenches. The undoped polysilicon layer is followed by the deposition of a layer of doped polysilicon. Typically, the thickness of the doped polysilicon layer is greater than the thickness of the undoped polysilicon layer. For example, the ratio of the thickness of the doped polysilicon layer to the undoped polysilicon layer may be 7:1, with a total thickness of about 8,000 angstroms.

Figure 4A:
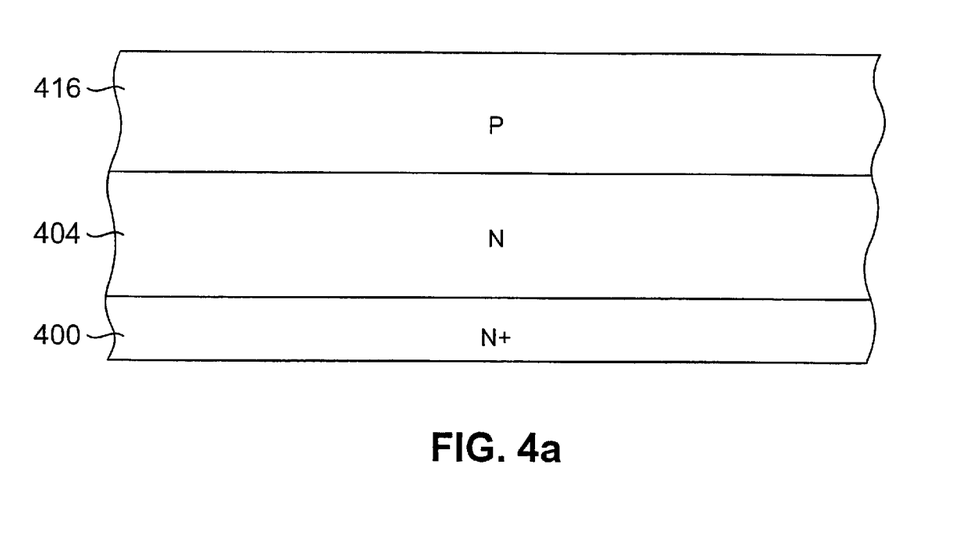
FIGS. 4(a)—4(f) illustrate a sequence of process steps forming the trench DMOS transistor shown in FIG. 3.
Figure 4B:
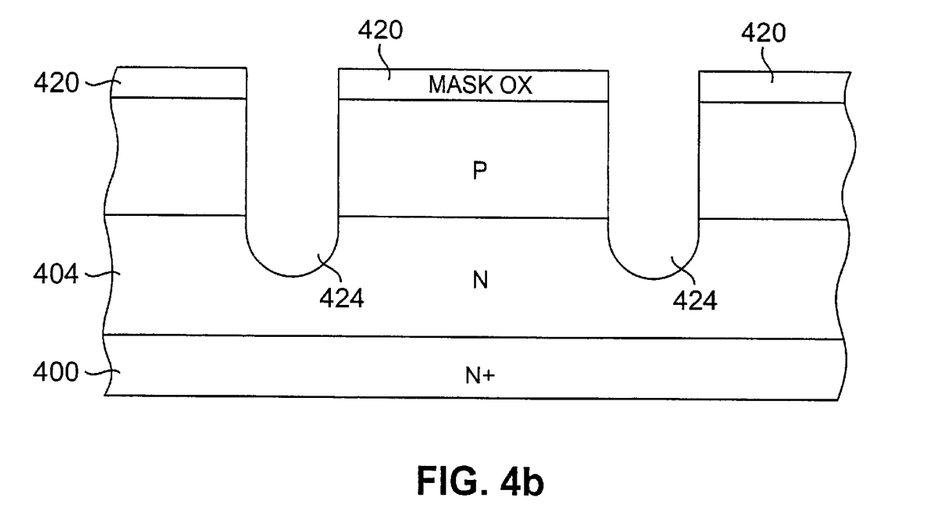
Figure 4C:
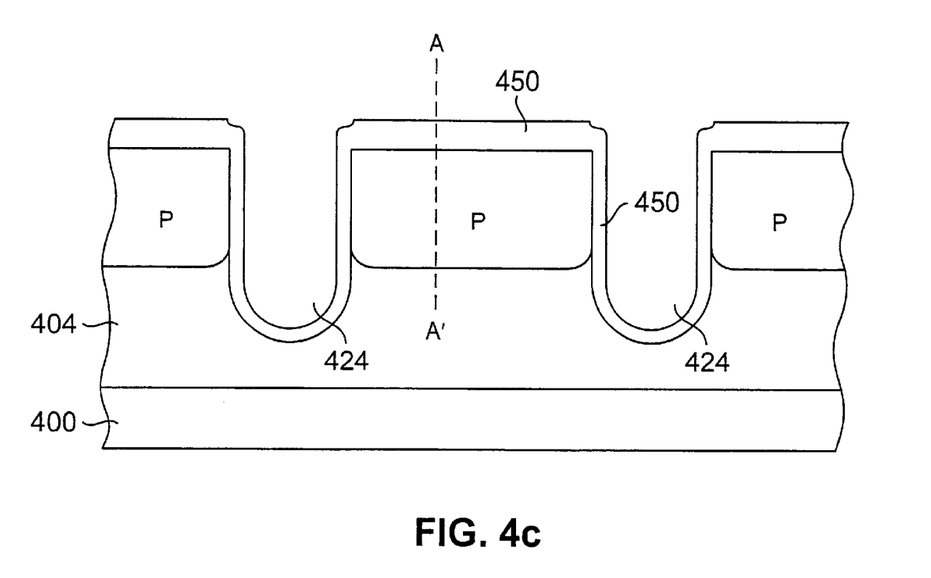
Figure 4D:
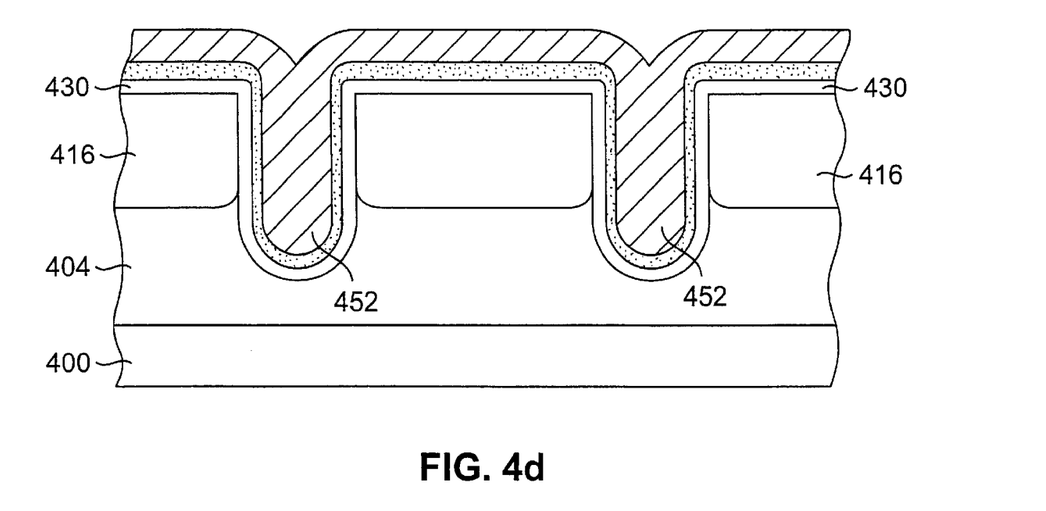

The undoped polysilicon layer is advantageously employed as a buffer layer inhibits the penetration of dopant material through the gate oxide layer and into the p-body.

Figure 4E:
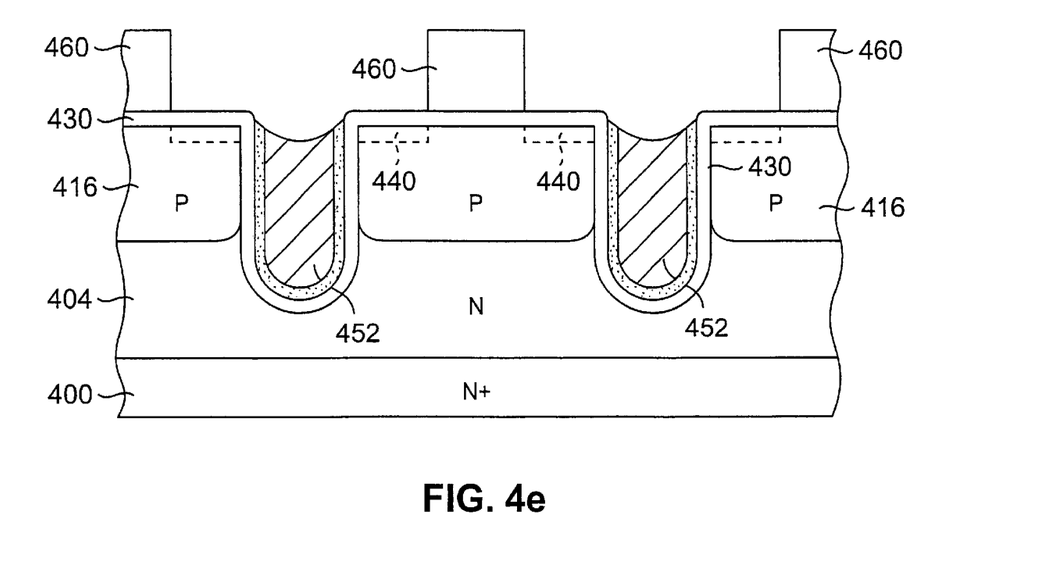
Figure 4F:
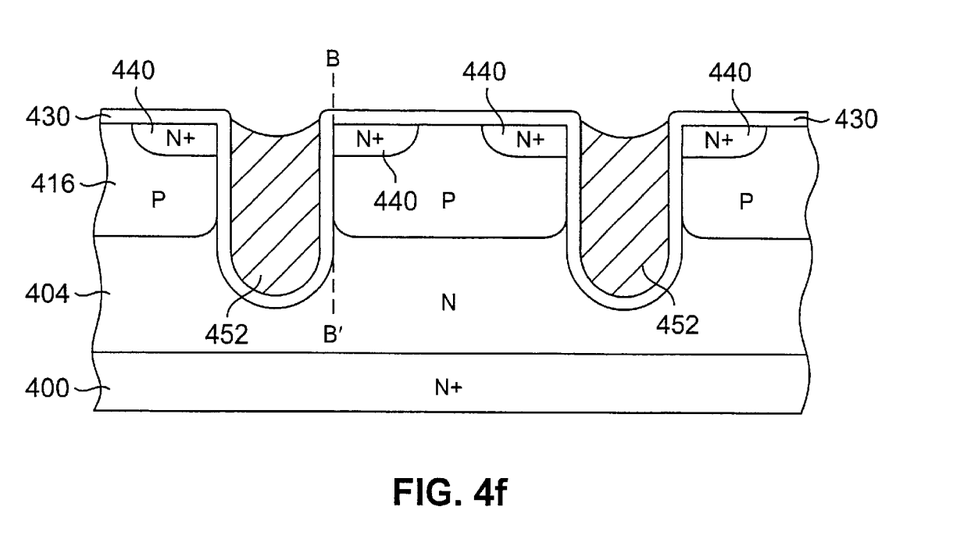

In FIG. 4(e), the polysilicon layer 452 is etched to optimize its thickness and to expose the portion of the gate oxide layer 430 that extends over the surface of p-body 416. Next, a photoresist masking process is used to form patterned masking layer 460. Patterned masking layer 460 defines source regions 440. Source regions 440 are then formed by two implantation steps and one diffusion step. For example, the source regions may be implanted with phosphorous at 200 KeV with a dosage between about $5\times10^{17}$ and $1\times10^{18}$ cm$^{-3}$. Arsenic may then be implanted at 80 KeV with a dosage between about $4\times10^{19}$ and $8.0\times10^{19}$. After implantation, the phosphorous is diffused to a depth of approximately 0.45 microns. The arsenic may be diffused to a depth of only about 0.15 microns due to its small diffusion coefficient and small implantation energy. Thus, the resulting source region includes a layer lightly doped with phosphorous over which is deposited a layer more heavily doped with arsenic. Finally, masking layer 460 is removed in a conventional manner to form the structure depicted in FIG. 4(f).

The trench DMOS transistor is completed in a conventional manner by forming and patterning a BPSG layer over the structure to define BPSG regions associated with the source and gate electrodes. Also, a drain contact layer is formed on the bottom surface of the substrate. Finally, a pad mask is used to define pad contacts.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a trench DMOS in which the conductivities of the various semiconductor regions are reversed from those described herein.

What is claimed is:

1. A trench DMOS transistor cell, comprising:
   a substrate of a first conductivity type;
   a body region on the substrate, said body region having a second conductivity type;
   at least one trench extending through the body region and the substrate;
   an insulating layer that lines the trench;
   a conductive electrode in the trench overlying the insulating layer; and
   a source region of the first conductivity type in the body region adjacent to the trench, said source region including a first layer and a second layer disposed over said first layer, said first layer having a lower dopant concentration of the first conductivity type relative to the dopant concentration of the second layer.

2. The trench DMOS transistor cell of claim 1 wherein at least a portion of the first layer of the source region extends to a depth below a surface level of the conductive electrode.

3. The trench DMOS transistor cell of claim 1 wherein substantially all of the first layer of the source region extends to a depth below a surface level of the conductive electrode.

4. The trench DMOS transistor cell of claim 1 wherein at least a portion of the first layer of the source region and substantially none of the second layer extends to a depth below a surface level of the conductive electrode.

5. The trench DMOS transistor cell of claim 1 wherein said body region includes a contact region more heavily doped than an underlying portion of the body region, said contact region providing electrical contact to the underlying body region.

6. The trench DMOS transistor cell of claim 1 wherein said first layer is doped to a concentration between about $5\times10^{17}$ and $5\times10^{18}$ cm$^{-3}$ and the second layer is doped to a concentration between about $4\times10^{19}$ and $8.0\times10^{19}$.

7. The trench DMOS transistor cell of claim 1 wherein said first layer is doped with phosphorous and said second layer is doped with arsenic.

8. The trench DMOS transistor cell of claim 6 wherein said first layer is doped with phosphorous and said second layer is doped with arsenic.

9. The trench DMOS transistor cell of claim 1 further comprising a drain electrode disposed on a surface of the substrate opposing the body region.

10. The trench DMOS transistor cell of claim 1 wherein said insulating layer is an oxide layer.

11. The trench DMOS transistor cell of claim 1 wherein said conductive electrode includes polysilicon.

12. The trench DMOS transistor cell of claim 11 wherein said polysilicon includes a dopant material.

13. The DMOS transistor cell of claim 11 wherein said polysilicon includes a layer of undoped polysilicon and a layer of doped polysilicon.

14. A trench DMOS transistor structure that includes a plurality of individual trench DMOS transistor cells formed on a substrate of a first conductivity type, each of said individual trench DMOS transistor cells comprising:
   a substrate of a first conductivity type;
   a body region on the substrate, said body region having a second conductivity type;
   at least one trench extending through the body region and the substrate;
   an insulating layer that lines the trench;
   a conductive electrode in the trench overlying the insulating layer; and
   a source region of the first conductivity type in the body region adjacent to the trench, said source region including a first layer and a second layer disposed over said first layer, said first layer having a lower dopant concentration of the first conductivity type relative to the dopant concentration of the second layer.

15. The trench DMOS transistor structure of claim 14 wherein at least a portion of the first layer of the source region extends to a depth below a surface level of the conductive electrode.

16. The trench DMOS transistor structure of claim 14 wherein substantially all of the first layer of the source region extends to a depth below a surface level of the conductive electrode.

17. The trench DMOS transistor structure of claim 14 wherein at least a portion of the first layer of the source region and substantially none of the second layer extends to a depth below a surface level of the conductive electrode.

18. The trench DMOS transistor structure of claim 14 wherein said body region includes a contact region more heavily doped than an underlying portion of the body region, said contact region providing electrical contact to the underlying body region.

19. The trench DMOS transistor structure of claim 14 wherein said first layer is doped to a concentration between about $5\times10^{17}$ and $5\times10^{18}$ cm$^{-3}$ and the second layer is doped to a concentration between about $4\times10^{19}$ and $8.0\times10^{19}$.

20. The trench DMOS transistor structure of claim 14 wherein said first layer is doped with phosphorous and said second layer is doped with arsenic.

21. The trench DMOS transistor structure of claim 19 wherein said first layer is doped with phosphorous and said second layer is doped with arsenic.

22. The trench DMOS transistor structure of claim 14 further comprising a drain electrode disposed on a surface of the substrate opposing the body region.

23. The trench DMOS transistor structure of claim 14 wherein said insulating layer is an oxide layer.

24. The trench DMOS transistor structure of claim 14 wherein said conductive electrode includes polysilicon.

25. The trench DMOS transistor structure of claim 24 wherein said polysilicon includes a dopant material.

26. The DMOS transistor structure of claim 24 wherein said polysilicon includes a layer of undoped polysilicon and a layer of doped polysilicon.

27. The DMOS transistor structure of claim 14 wherein at least one of said trench DMOS transistor cells have a closed cell geometry.

28. The DMOS transistor structure of claim 14 wherein at least one of said trench DMOS transistor cells have an open cell geometry.

* * * * *

UNITED STATES PATENT AND TRADEMARK OFFICE
CERTIFICATE OF CORRECTION

PATENT NO. : 6,445,037 B1  Page 1 of 1
DATED : September 3, 2002
INVENTOR(S) : Fwu-Iuan Hshieh et al.

It is certified that error appears in the above-identified patent and that said Letters Patent is hereby corrected as shown below:

Column 2,
Line 16, after "about" change "4 X $10^9$" to -- 4 X $10^{19}$ --.

Column 3,
Line 19, after "about", change "100 M/in2" to -- 100M/$in^2$ --.

Column 4,
Line 10, after "about" change "200 M cells/$in^2$)" to -- 200 M cells/$in^2$. --.
Line 28, after "region", delete ".".

Column 8,
Line 5, after "cells", change "have" to -- has --.
Line 9, after "cells", change "have" to -- has --.

Signed and Sealed this

Twenty-ninth Day of July, 2003

JAMES E. ROGAN
*Director of the United States Patent and Trademark Office*